(12) United States Patent
Uemori et al.

(10) Patent No.: US 7,027,722 B2
(45) Date of Patent: Apr. 11, 2006

(54) ELECTRIC HEATER FOR A SEMICONDUCTOR PROCESSING APPARATUS

(75) Inventors: Susumu Uemori, Tenri (JP); Takashi Aitani, Tenri (JP)

(73) Assignee: Koyo Thermo Systems Co., Ltd., Tenri (JP)

( * ) Notice: Subject to any disclaimer, the term of this patent is extended or adjusted under 35 U.S.C. 154(b) by 0 days.

(21) Appl. No.: 10/503,138

(22) PCT Filed: Nov. 25, 2002

(86) PCT No.: PCT/JP02/12253

§ 371 (c)(1),
(2), (4) Date: Aug. 11, 2004

(87) PCT Pub. No.: WO2004/049414

PCT Pub. Date: Jun. 10, 2004

(65) Prior Publication Data

US 2005/0082281 A1 Apr. 21, 2005

(51) Int. Cl.
*F26B 19/00* (2006.01)

(52) U.S. Cl. ............... 392/416; 392/418; 219/390; 219/405; 219/411; 118/724; 118/725; 118/50.1

(58) Field of Classification Search ............... 219/390, 219/405, 411; 392/416, 418; 118/724, 725, 118/50.1

See application file for complete search history.

(56) References Cited

U.S. PATENT DOCUMENTS 5,324,920 A * 6/1994 Nakao ................... 219/542
6,737,613 B1 * 5/2004 Yamaguchi et al. ........ 219/390

FOREIGN PATENT DOCUMENTS

| JP | 04-155828 | 5/1992 |
|---|---|---|
| JP | 2001-267249 | 9/2001 |
| JP | 2001-267261 | 9/2001 |

* cited by examiner

*Primary Examiner*—Shawntina Fuqua
(74) *Attorney, Agent, or Firm*—Armstrong, Kratz, Quintos, Hanson & Brooks, LLP

(57) ABSTRACT

An electric heater has multiple zones, wherein the multiple zones include at least one zone which is subject to high loading (e.g. bottom zone) and, at least one zone is a non-metal heating element, and the rest of the zones (e.g. middle zone and top zone) are metal resistance heating elements of light gauge overbent.

8 Claims, 6 Drawing Sheets

ELECTRIC HEATER FOR A SEMICONDUCTOR PROCESSING APPARATUS

TECHNICAL FIELD

The present invention relates to an electric heater which is preferably used for an apparatus to perform heat treatments such as oxidation, diffusion, and/or CVD on semiconductor wafers.

BACKGROUND ART

Conventionally, an electric heater for a batch type heat-treating equipment for semiconductor wafers is known, such as one employing a metal resistance heating element (cf. Japanese Patent Unexamined Publication No. 2001-267261 bulletin), and another employing a non-metal resistance heating element (cf. Japanese Patent Bulletin No. 3307924).

A heating element as described in Japanese Patent Unexamined Publication No. 2001-267261 bulletin employs, as a metal wire, a Kanthal (brand name) wire made of iron/chrome/aluminum system or a similar material, of around 1–3 mm wire diameter called "light gauge". Besides, a heating element which employs a Kanthal wire or a similar material, of around 7–10 mm wire diameter called "heavy gauge" is used. In case of a heater which employs either of a Kanthal wire and its equivalents as a material of a heating element, the temperature of the heating element can reach 1250–1300 degrees Celsius at maximum when the heater temperature is 1200 degrees Celsius; and because the heating element starts to creep and is susceptible to damage at temperatures of above 1200 degrees Celsius, the set temperature of the heat treating equipment employing this type of heating element is limited to temperatures not higher than 1200 degrees Celsius or so. Additionally, at one end zone of a heater, for example, at the bottom zone of a vertical furnace, unfavorable thermal insulation condition due to charging, discharging of the work, and existence of moving section can cause increased loading; so that a problem with such a zone has been that deformation and/or breaking of a metal resistance heating element can occur more frequently.

Then, employing a non-metal resistance heating element as described in the Japanese Patent Bulletin No.3307924 would enable an application of a heater at higher temperatures compared with a heater which employs a metal resistance heating element; however, because a non-metal resistance heating element is expensive, fragile and easy to break, a problem with such a heating element has been that not only its initial cost but also repair cost on failure are high.

In view of the above-mentioned fact, the purpose of the present invention is to provide an electric heater for semiconductor processing equipments which is inexpensive and usable without problems even at high temperature.

DISCLOSURE OF INVENTION

An electric heater for semiconductor processing equipments according to the present invention is characterized by a cylindrically shaped multi-zone electric heater for semiconductor processing equipments wherein, the multiple zones include at least one zone which is subject to high loading, the said at least one zone comprises a non-metal heating element, and the rest of the zones comprise metal resistance heating elements.

Among metals as a material of a metal resistance heating element, Kanthal wire (Kanthal A1 wire, Kanthal APM wire, etc.), a material which bears high temperature, or its substitute is preferred; and moreover, Kanthal APM wire or its substitute is particularly preferred. As for geometry of the metal resistance heating element, either of a thin wire bent to a sinuous shape (light gauge overbent) and a thick wire formed to a helical coil (heavy gauge helical coil) is preferred; and, a light gauge metal heating element is more preferred in that it is light weight and allows for fast heat-up and cool-down. Further, as stated above, since the only differences between the light gauge and the heavy gauge heating elements are energy saving character and heat response character other than the wire weight (resources saving character), it is desired to use either or both of the gauges properly, depending on the specifications of the processing equipment where the heater is employed, or the specifications of the heater power supply, etc.

As a non-metal resistance heating element, either of ceramics such as molybdenum-di-silicide ($MoSi_2$), graphite, and silicon carbide is preferred, and molybdenum-di-silicide is particularly preferred in that it suffers little degradation in the atmospheric air. When graphite or silicon carbide is employed as a non-metal resistance heating element, it is desired to enclose the heating element in a heating element container kept under vacuum. The maximum surface load of molybdenum-di-silicide is $20W/cm^2$, whereas that of Kanthal wire which is a metal wire of iron/chrome/aluminum system is 2 to $3.5W/cm^2$; therefore, employing molybdenum-di-silicide can render 10 times as greater heat generation at maximum as compared with a metal wire. Molybdenum-di-silicide can be used at high temperature range of up to 1800 degrees Celsius; and moreover, since it undertakes no aging effect, it requires no care about its life-time, providing another advantage.

Here, a plurality of zones, for example, in a vertical heater, consist of a bottom zone, a middle zone and a top zone, and in case where, for example, magnitude of the loading decreases in the order of the bottom zone, the top zone, and the middle zone, then, the bottom zone comprises a non-metal resistance heating element, and the middle zone and the top zone comprise metal resistance heating elements. In this case, the middle zone and the top zone are typically controlled independently. The middle zone consists of one or more zones, and total number of zones is chosen optionally from values not less than 3.

Because, with an electric heater for a semiconductor processing equipment according to the present invention, among the multiple zones is at least one zone which is subject to high loading and of which heating element is non-metal, risk of failure of the heating element by overheat in the said zone which is subject to high loading is eliminated; this allows for an operation of the heater even at high temperature without causing problems; and since the heating elements in the rest of the zones are metal, its cost can be reduced, and risk of their failure by mechanical shock can be reduced as well. Thus, an electric heater is available which, in view of heat resistant temperature, bears comparison with an electric heater employing only non-metal resistance heating elements in all zones, and moreover, is inexpensive and easy to handle. The electric heater is suitably employed for high temperature thermal processes such as CMOS process and/or SOI process.

Usually, the zone which is subject to high loading can be either the zone into which a mass of heating capacity is introduced from outside or the end zone on one or both sides with an opening from which a large amount of heat escapes outwards. Therefore, employing non-metal heating elements in such zones can yield ease of temperature control at the time of semi-conductor processing.

It is preferred that each zone consists of one or a plurality of blocks each of which comprises a heating element and thermal insulation body holding the heating element so that replacement can be made by the block. In the case of a vertical furnace where a plurality of zones consist of a bottom zone, a middle zone, and a top zone, the bottom zone corresponds to the end zone on the said one side. For example, the bottom zone may be formed by a pair of half cylinder blocks put together facing one another, and the middle zone and the top zone may be formed by a pair of half cylinder blocks put together facing one another. The bottom zone may be formed simply by a cylinder block, and the middle zone and the top zone may also be formed altogether by a cylinder block. In this case, when a heating element breaks down at any of the blocks, it is physically possible to replace merely the block including faulty part; moreover, in case where reuse of the thermal insulation body is allowed, then replacing the heating element alone is possible, thus enabling repair of the electric heater at a minimal additional cost.

BEST MODE FOR CARRYING OUT THE INVENTION

Figure 1:
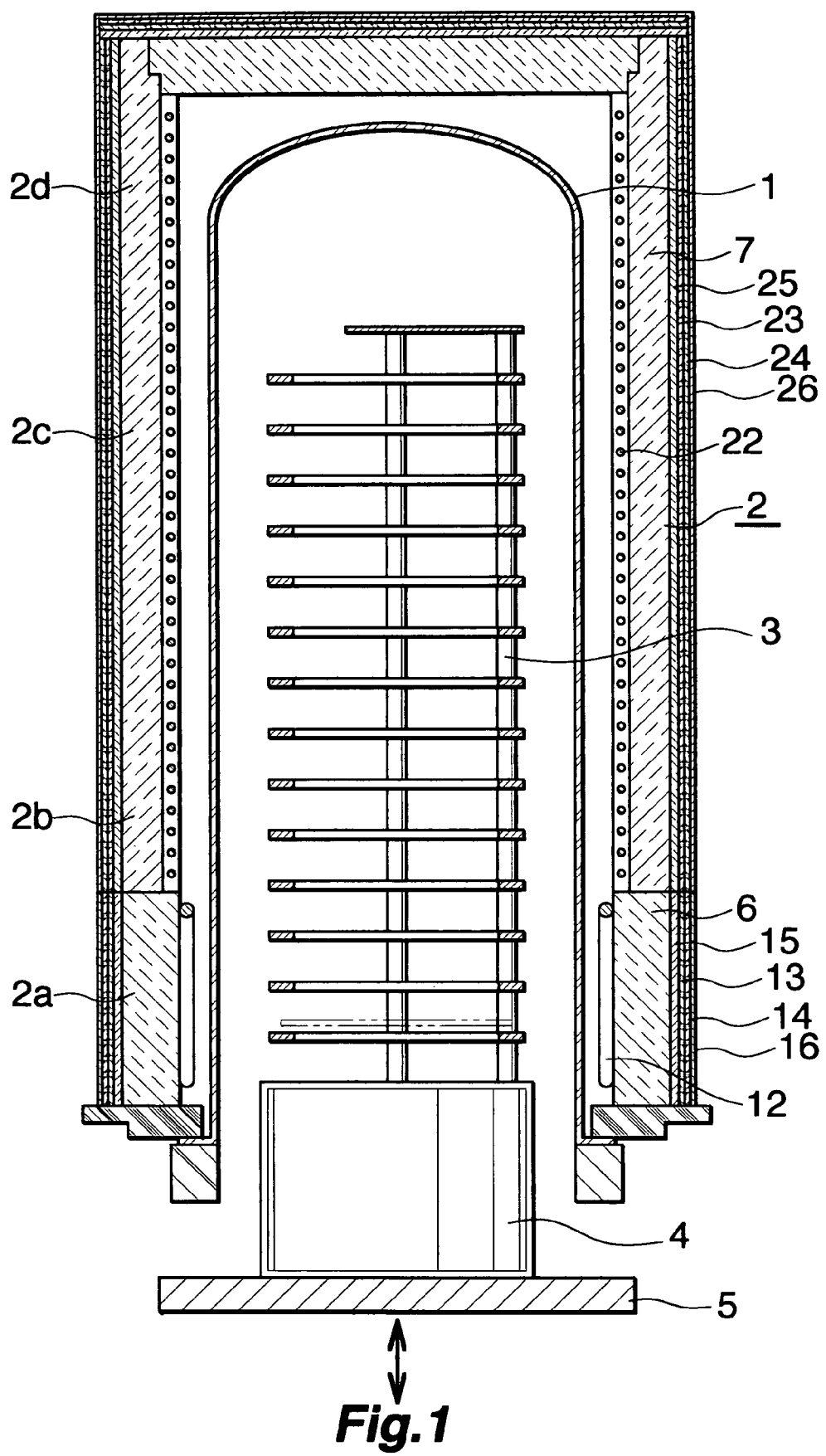
FIG. 1 is a vertical sectional view showing an example of a semiconductor processing equipment in which an electric heater by the present invention is employed.

Best mode for carrying out the present invention is explained below, referring to the drawings.

FIG. 1 shows a vertical diffusion furnace which is an example of a semiconductor processing equipment, in which an electric heater by the present invention is employed; the vertical diffusion furnace comprises a process tube (1) to perform a heat treatment for semiconductor wafers, an electric heater (2) installed surrounding the process tube (1), a boat (3) which is mounted on a heat insulating cylinder (4) and can carry a number of semiconductor wafers, and a flange cap (5) which supports the heat insulating cylinder (4), performs a vertical movement (up/down), and closes a boat insertion opening at the bottom end of the process tube (1) at the time of the treatment.

The electric heater (2) is sectioned in four control zones consisting of the bottom zone (2a) as the end zone, the middle zones (2b)(2c) consisting of two zones, and the top zone (2d); the electric heater (2) consists of two parts, the non-metal resistance heating element applied part (6) which comprises a non-metal resistance heating element (12) and composes the bottom zone (2a), and the metal resistance heating element applied part (7) which comprises metal resistance heating elements (22) and composes the remaining zones, i.e. the two middle zones (2b) (2c) and the top zone (2d).

Figure 2:
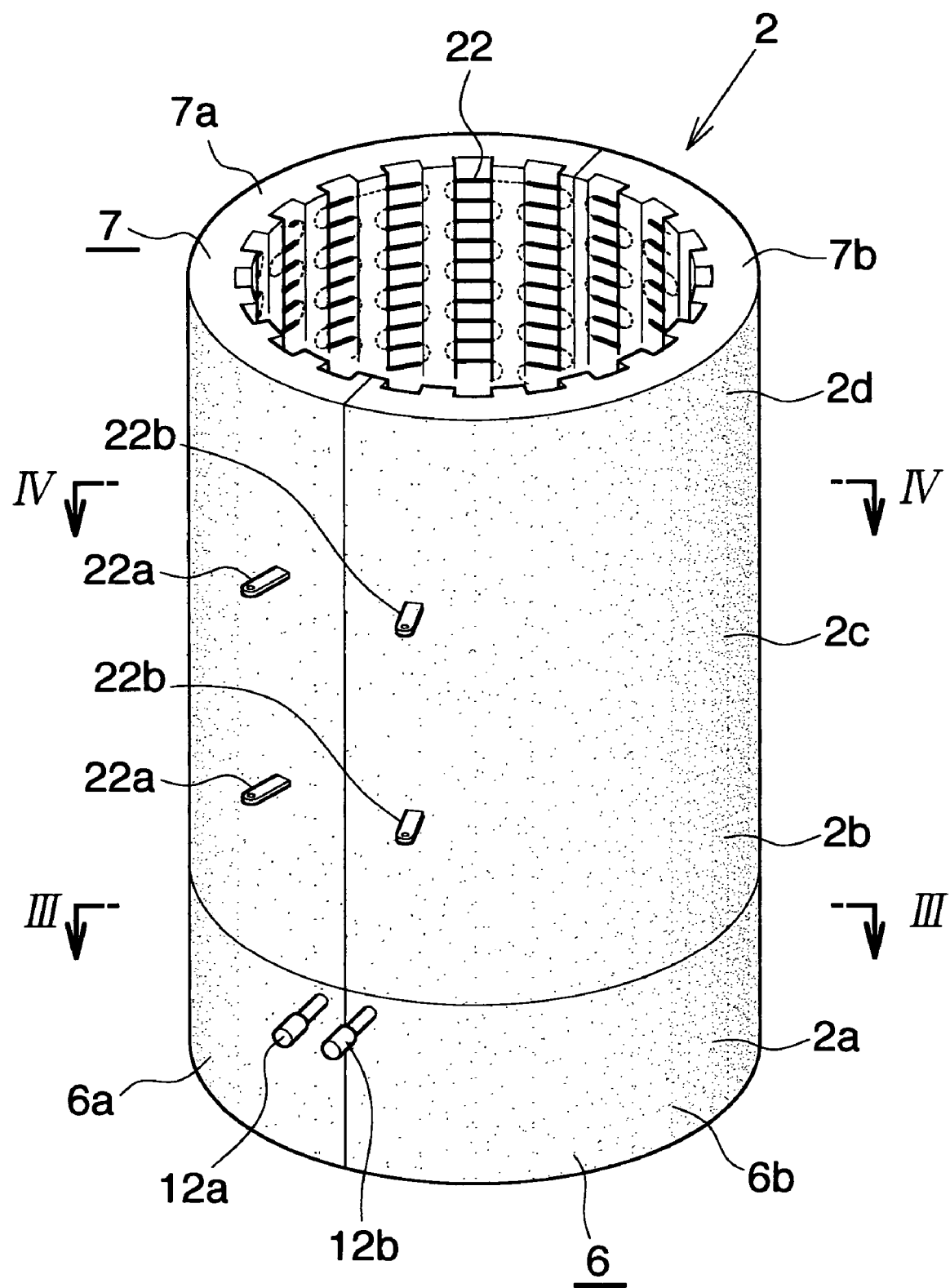
FIG. 2 is a perspective view to show an example of a block configuration of an electric heater by the present invention for a semiconductor processing equipment.

In the electric heater (2) of the first embodiment, the non-metal resistance heating element applied part (6) is formed as shown in FIG. 2 by a pair of half cylinder body blocks (6a) (6b) made to face one another, and the metal resistance heating element applied part (7) is formed by a pair of half cylinder body blocks (7a)(7b) made to face one another.

Figure 3:
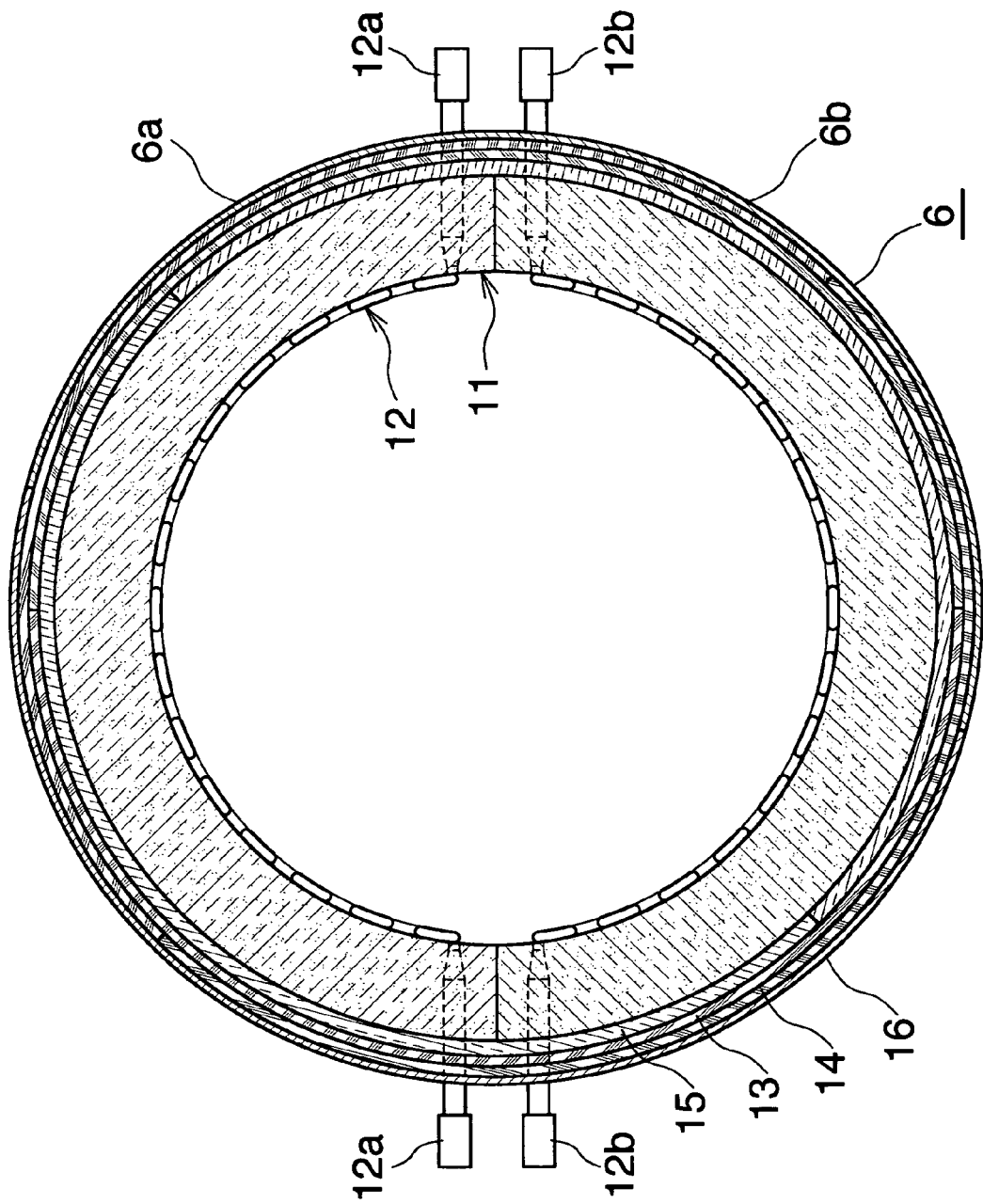
FIG. 3 is a sectional view of the post-assembly heater along the III—III Line of FIG. 2.
Figure 5:
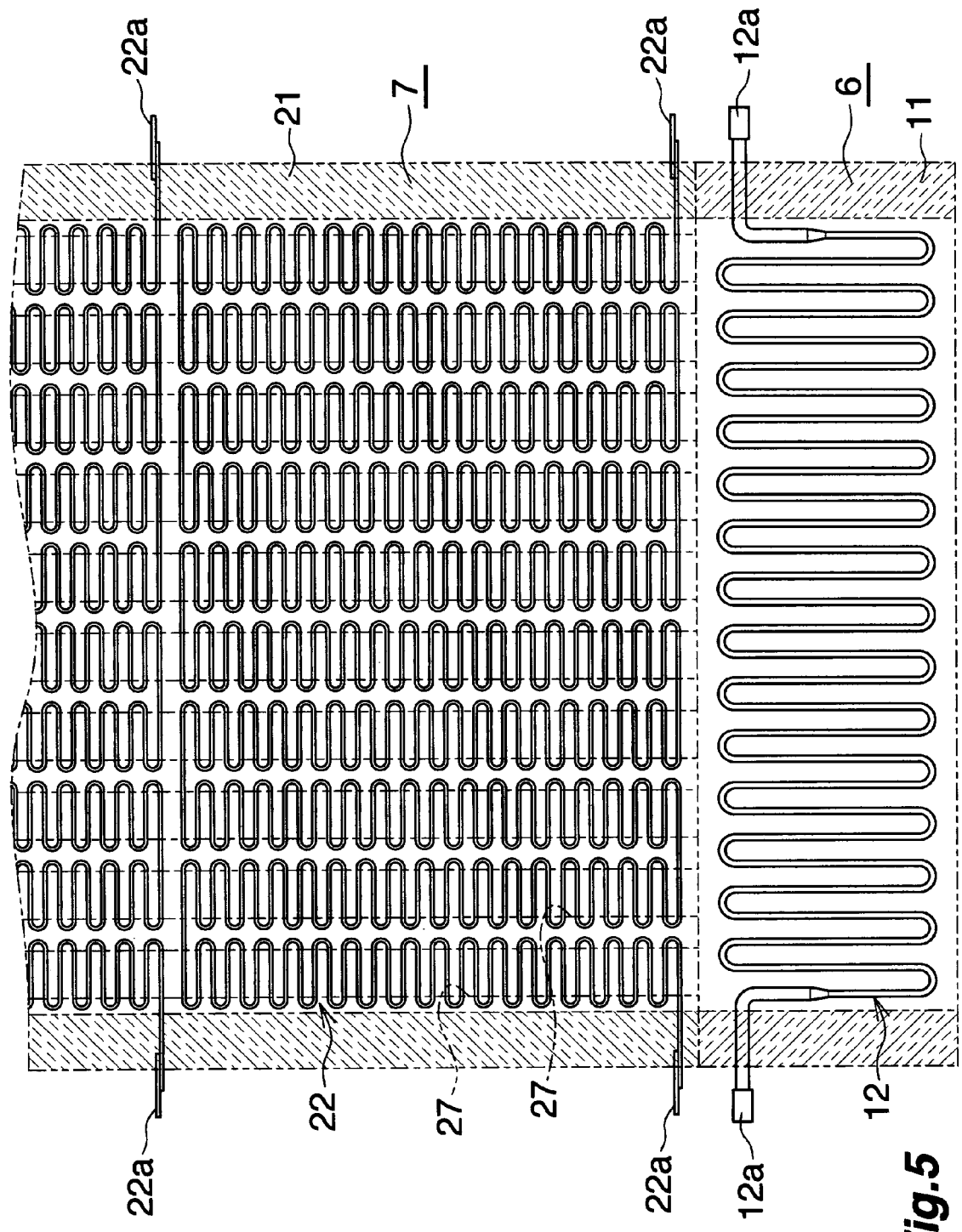
FIG. 5 is a development view watched from inside of an electric heater by the present invention for a semiconductor processing equipment.

As shown in detail in FIGS. 3 and 5, the non-metal resistance heating element applied part (6) of the electric heater (2) comprises a cylindrical main thermal insulation body (11) made of ceramic fiber, a non-metal resistance heating element (12) installed on an internal perimeter surface of the cylindrical main thermal insulation body (11), an inner thermal insulating material layer (13) and an outer thermal insulating material layer (14) both of which jacket the main thermal insulation body (11), a flexible ceramic fiber mat (15) laid between the body (11) and the layers (13)(14) as a buffer, and a metal shell (16) covering outside perimeter surface of the outer thermal insulating material layer (14).

The non-metal resistance heating element (12) is made of molybdenum-di-silicide, formed to a sinuous shape, and supported at the internal perimeter surface of the main thermal insulation body (11). The non-metal resistance heating element (12) made of molybdenum-di-silicide has an advantage that it can be used with a large surface electric power load density even at high temperature, and this allows each zone (2a)(2b)(2c)(2d) to heat-up to a predetermined temperature in a short time; otherwise, the bottom zone (2a) would be hard to heat-up in comparison with the other zones (2b)(2c)(2d).

Each half cylinder body block (6a) or (6b) of the non-metal resistance heating element applied part (6) comprises a pair of heater terminals (12a) or (12b) respectively, so that one can replace just either of half cylinder body blocks alone (6a)(6b).

Figure 4:
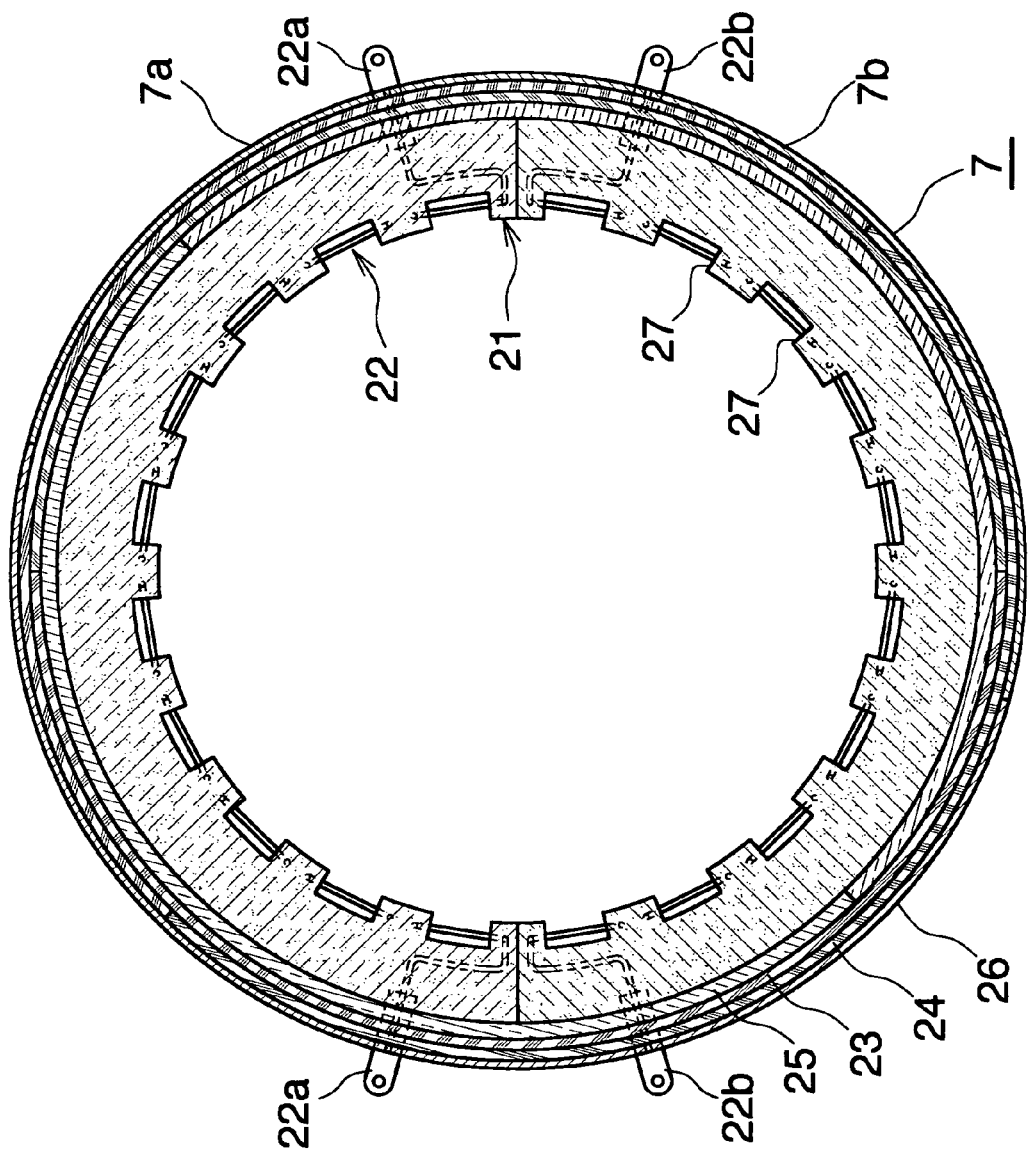
FIG. 4 is a sectional view of the post-assembly heater along the IV—IV Line of FIG. 2.

As shown in detail in FIGS. 4 and 5, the metal resistance heating element applied part (7) of the electric heater (2) comprises a cylindrical main thermal insulation body (21) made of ceramic fiber, a metal resistance heating element (22) installed on an internal perimeter surface of the cylindrical main thermal insulation body (21), an inner thermal insulating material layer (23) and an outer thermal insulating material layer (24) both of which jacket the main thermal insulation body (21), a flexible ceramic fiber mat (25) laid between the body (21) and the layers (23)(24) as a buffer, and a metal shell (26) covering outside perimeter surface of the outer thermal insulating material layer (24). To an internal perimeter surface of the main thermal insulation body (21) of the metal resistance heating element applied part (7) are formed a plurality of parallel grooves (27) with a distance in the perimeter direction, each extending along the length direction of the main thermal insulation body (21).

The metal resistance heating element (22) is made of iron/chrome/aluminum system metal wire (fe is contained as the main component, and typically contains Cr 22%, Al 5.8%; e.g Kanthal wire) and has a wire diameter of around 1–3 mm which is referred to as "light gauge". The metal resistance heating element (22) is formed to a sinuous shape and its amplitude is made to be bigger than the width of the groove (27). Then, the metal resistance heating element (22)

is supported unitedly in the main thermal insulation body (21) by both sides part in widthwise direction of the metal resistance heating element (22) entering in the main thermal insulation body (21) from both sides of the groove (27).

Each half cylinder body block (7a) or (7b) of the metal resistance heating element applied part (7) comprises a pair of heater terminals (22a) or (22b) in each of the middle zones (2b)(2c) and the top zone (2d), so that one can replace merely either of half cylinder body blocks (7a)(7b).

With the configuration of the above-mentioned electric heater (2) which splits into the non-metal resistance heating element applied part (6) and the metal resistance heating element applied part (7), when a failure occurs such as damage caused by mechanical shock on the non-metal resistance heating element applied part (6) or breaking of the wire caused by wear of the metal resistance heating element applied part (7), it is possible to replace just either the non-metal resistance heating element applied part (6) or the metal resistance heating element applied part (7) alone. Moreover, since the non-metal resistance heating element applied part (6) and the metal resistance heating element applied part (7) are respectively formed by a pair of half cylinder body blocks (6a)(6b) and (7a)(7b) made to face one another, it is even possible to replace just either of the half cylinder body blocks (6a)(6b)(7a)(7b) alone which has failed; this allows for ease of repair at a reasonable cost.

Figure 6:
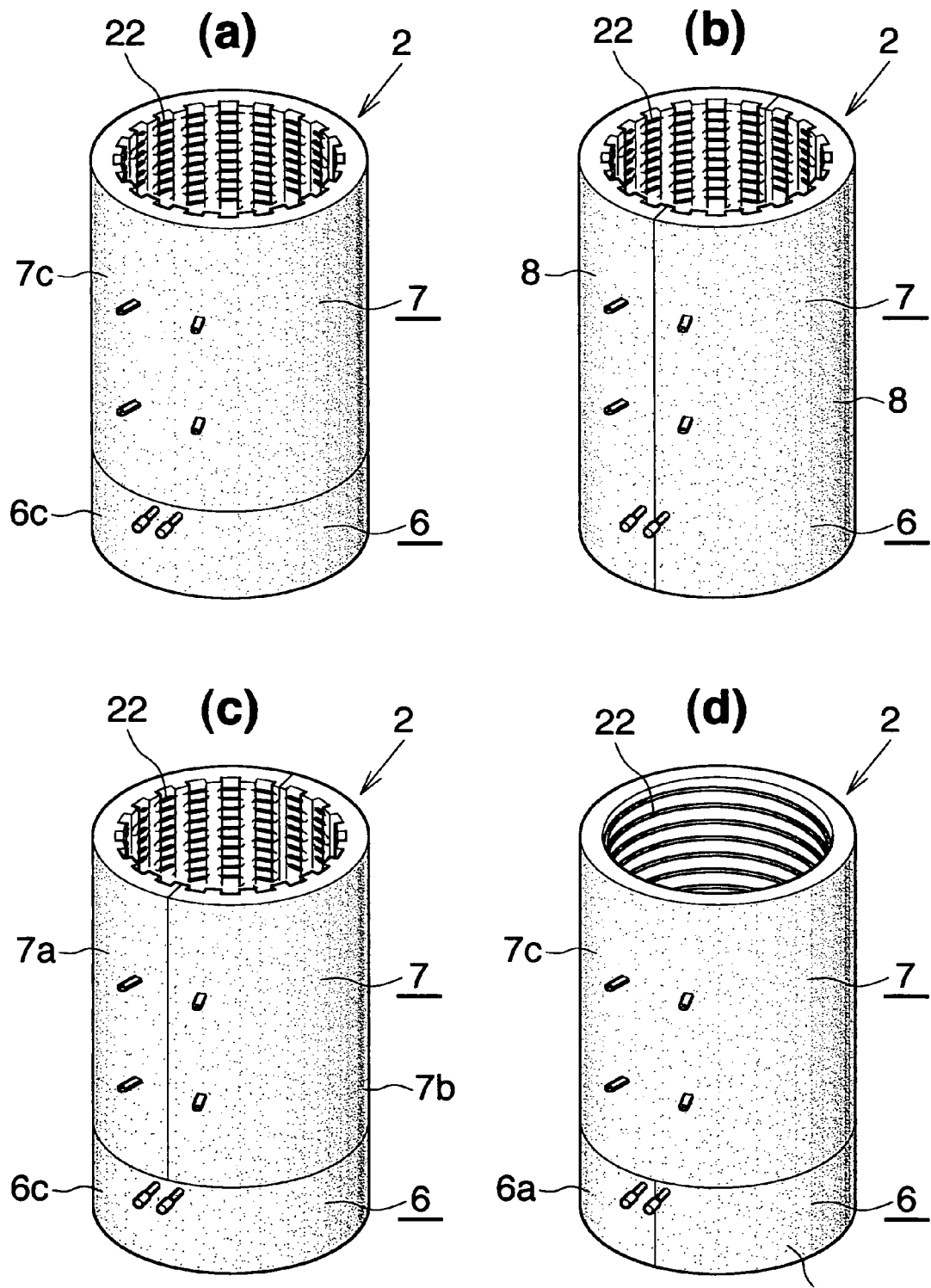
FIG. 6 depicts some perspective views to show some variations (differences in mode of divisions) of an electric heater for a semiconductor processing equipment by the present invention.

In the above-mentioned example, the non-metal resistance heating element applied part (6) and the metal resistance heating element applied part (7) are formed by a pair of half cylinder body blocks (6a)(6b) and (7a)(7b) made to face one another respectively. However, various forms of divisions other than this embodiment are possible, and some of those examples are shown in FIG. 6.

In an electric heater (2) shown in FIG. 6(a), the non-metal resistance heating element applied part (6) and the metal resistance heating element applied part (7) are formed by a cylinder block (6c) and (7c) respectively. In an electric heater (2) shown in FIG. 6(b), a combination of the non-metal resistance heating element applied part (6) and the metal resistance heating element applied part (7) is formed by a pair of half cylinder blocks (8)(8) made to face one another. In an electric heater (2) shown in FIG. 6(c), the non-metal resistance heating element applied part (6) is formed by a cylinder block (6c), and the metal resistance heating element applied part (7) is formed by a pair of half cylinder blocks (7a)(7b) made to face one another. In an electric heater (2) shown in FIG. 6(d), the non-metal resistance heating element applied part (6) is formed by a pair of half cylinder blocks (6a)(6b) made to face one another, and the metal resistance heating element applied part (7) is formed by a cylinder block (7c). Additionally, in FIG. 6(a) to (c), the metal resistance heating element (22) is illustrated as a light gauge overbent, whereas in FIG. 6(d), the metal resistance heating element (22) is illustrated as a heavy gauge helical coil.

Although the above-mentioned embodiments describes an electric heater (2) employed in a vertical furnace, the electric heater (2) can naturally be employed in a horizontal furnace as well. Moreover, the electric heater (2) by the present invention may have either both ends open or one end closed, and its form is not limited. Further, although the metal resistance heating element (22) has been explained as that of light gauge sinuous shape, the present invention can naturally be applied to heavy gauge helical coil as well.

What is claimed is:

1. A cylindrically shaped multi-zone electric heater for a semiconductor processing equipment,
    wherein the heater comprises multiple zones aligned to form a cylindrical shape and the multiple zones include at least one zone which is subject to high loading, the said at least one zone comprises a non-metal heating element, and the rest of the zones comprise metal resistance heating elements.

2. The electric heater for a semiconductor processing equipment as claimed in claim 1,
    wherein the one or more zones of which heating elements are non-metal heating elements correspond to the said at least one end zone.

3. The electric heater for a semiconductor processing equipment as claimed in claim 1,
    wherein the metal resistance heating element is of light gauge wire overbent.

4. The electric heater for a semiconductor processing equipment as claimed in claim 1,
    wherein the non-metal resistance heating element is of molybdenum-di-silicide.

5. The electric heater for a semiconductor processing equipment as claimed in claim 1,
    wherein each zone comprises a heating element and one or more blocks which hold the heating elements and consist of thermal insulation bodies, the blocks being replaceable in block unit.

6. The electric heater for a semiconductor processing equipment as claimed in claim 2,
    wherein the metal resistance heating element is of light gauge wire overbent.

7. The electric heater for a semiconductor processing equipment as claimed in claim 2,
    wherein the non-metal resistance heating element is of molybdenum-di-silicide.

8. The electric heater for a semiconductor processing equipment as claimed in claim 2,
    wherein each zone comprises a heating element and one or more blocks which hold the heating elements and consist of thermal insulation bodies, the blocks being replaceable in block unit.

* * * * *